United States Patent [19]

Johnston, Jr. et al.

[11] 4,074,305
[45] Feb. 14, 1978

[54] GaAs LAYERS AS CONTACTS TO THIN FILM SEMICONDUCTOR LAYERS

[75] Inventors: Wilbur Dexter Johnston, Jr., Holmdel; Joseph Leo Shay, Marlboro, both of N.J.

[73] Assignee: Bell Telephone Laboratories, Incorporated, Murray Hill, N.J.

[21] Appl. No.: 742,519

[22] Filed: Nov. 16, 1976

[51] Int. Cl.$^2$ .............................................. H01L 23/48
[52] U.S. Cl. .................................. 357/67; 136/89 CC; 136/89 TF; 148/33.4; 357/16; 357/30; 357/65
[58] Field of Search ...................... 357/30, 61, 65, 16, 357/67, 4, 59, 71; 136/89 TF, 89 CC; 148/33, 33.1, 33.4, 33.5, 33.6; 427/74, 87; 29/572

[56] References Cited

U.S. PATENT DOCUMENTS

| | | | |
|---|---|---|---|
| 3,802,967 | 4/1974 | Ladany et al. | 148/33.4 |
| 3,914,785 | 10/1975 | Ketchow | 357/63 |

OTHER PUBLICATIONS

Y. Nakayama et al., "Submicron GaAs Epitaxial Layer from Diethylgalliumchloride and Arsine", J. Electrochem. Soc. Aug. 1976, pp. 1227–1231.

H. M. Manasevit et al., "The Use of Metal–Organics in the Preparation of Semiconductor Materials" J. Electrochem. Soc.: Solid State Science, Dec. 1969, pp. 1725–1732.

K. J. Bachmann et al., "Polycrystalline Thin Film InP/CdS solar Cell", Applied Physics Letters, vol. 29, No. 2, 15 Jul. 1976 pp. 121–123.

W. D. Johnston, Jr. et al., "Growth and Characterization of VPE Thin Film AlAs–GaAs Heterojunction layers", Conference Abstract for 6th Int. Symp. N. Amer. Conf. On GaAs & Related Compounds, Sept. 1976, p. 29.

*Primary Examiner*—Stanley D. Miller, Jr.
*Assistant Examiner*—James W. Davie
*Attorney, Agent, or Firm*—Bruce S. Schneider

[57] ABSTRACT

Electrical contact between a conducting substrate, e.g., graphite, and a polycrystalline semiconductor layer of, for example p-type indium phosphide in a semiconductor device is made through a p-type GaAs intermediary layer. The GaAs layer is deposited on the conducting substrate by conventional methods such as chemical vapor deposition. The indium phosphide layer can then be deposited on the GaAs by similar techniques. The specific resistance and blocking voltage of such an interface is typically below 2 $\Omega$-cm$^2$ and 50 millivolts respectively. The efficiency of a p-InP/nCdS solar cell containing the improved electrical contact is measurably increased.

9 Claims, No Drawings

4,074,305

GAAS LAYERS AS CONTACTS TO THIN FILM SEMICONDUCTOR LAYERS

CROSS REFERENCE

This application is related to copending application U.S. Ser. No. 718,386 filed Aug. 27, 1976, U.S. Pat. No. 4,039,357.

BACKGROUND OF THE INVENTION

1. Field of the Invention

The invention concerns the making of an electrical contact to a polycrystalline layer of a semiconductor device.

2. Description of the Prior Art

A significant problem in the fabrication of semiconductor devices involves forming an electrical contact to an external circuit. By necessity to make such an electrical contact, a conducting material, one exhibiting metallic conduction properties, must be applied to a semiconductor material. Often this conductor-semiconductor interface produces a rectifying diode, i.e., a Schottky barrier. This happens, for example when InP is contacted with graphite or molybdenum. (see K. J. Bachmann, E. Buehler, J. L. Shay and S. Wagner, *Applied Physics Letters* 29, 121 (1976).) For most device applications formation of a barrier at a contact results in two significant problems. First, an unacceptably large voltage is typically needed to break down the barrier and second, even once the barrier is overcome it also often functions in effect as a unacceptably large resistance in series with the device. Therefore, for a more efficient device this blocking voltage and high resistance must usually be significantly reduced. For example blocking voltages less than 0.05 volts and specific resistances below 2 ohm-cm$^2$ are desirable for common applications of polycrystalline devices.

Various techniques have been developed to minimize the discussed contact problems. The most common methods entail alloying or diffusing a dopant into the surface region of a semiconductor material to produce a transition region between the area of the semiconductor region to be contacted and the active portion of the same region. The highly doped area approaches the conductive properties of the contact and acts as an effective intermediary. There are, however, a number of potential difficulties connected with heavily doping a semiconductor region. The doping must be sufficient to provide the conductivity properties necessary for an effective intermediary area. This level is often very high and can produce chemical deterioration of the semiconductor material or a change in the material's crystal structure, either effect resulting in degraded device characteristics. Additionally at high levels the dopant may segregate additional phases within the semiconductor, also producing a degradation.

The possible problems of doping by diffusion or alloying are compounded when the semiconductor material involved is a polycrystalline thin film. Because of the numerous grain boundaries in a polycrystalline thin layer, the depth of diffusion or alloying of a dopant into the semiconductor is more difficult to control. The relatively small thickness of such a film, typically between 0.5 and 20 micrometers, only enhances the difficulty. If too high a dopant level is introduced in the active area of the semiconductor—the area near the active junction—undesirable excessive electrical currents are produced during device operation. Indeed, in an extreme but not entirely unusual case, a short circuit is formed across the intended active junction. This latter result most often occurs when the dopant used is a fast diffuser in the particular semiconductor being doped. Exemplary of this possibility is the diffusion properties of zinc in indium phosphide. (See A. Hooper, B. Tuck and A. J. Baker, *Solid State Electronics*, 17, 531 (1974); L. L. Chang and H. C. Casey *Solid State Electronics*, 7, 481 (1964).)

The utilization of thin polycrystalline film semiconductor regions in the device also adds other complications. Clearly a thin semiconductor film has no substantial structural integrity and must be supported. Additionally, in a thin film device each layer must be grown on the adjacent layer with sufficient adhesion to maintain the necessary structural and electrical properties. For example, presently, although it is easy to produce good InP/CdS junctions by growing CdS on InP (see copending application Ser. No. 718,386 filed Aug. 27, 1976) the reverse growing sequence is more difficult. Thus, it is preferable to first deposit a layer of InP on a conducting substrate and then in sequence to deposit a layer of CdS on the InP. This requires a conducting substrate which offers adequate structural support for the device and upon which InP adheres without flaking or separation. Added to these structural and adhesion requirements are the electrical contact requisites previously discussed for an improved device.

For certain thin film devices, up to now, all the adhesion, structural, and contact requirements could not be entirely satisfied. Exemplary of this situation are InP/CdS thin film devices. As discussed, it is desirable to first put the InP layer on a conducting substrate. An InP layer deposited by a hydrogen transport chemical vapor deposition (CVD) process adheres to molybdenum or graphite substrates. (See Bachmann et al, *Appl. Phys. Letts.*, 29, 121 (1976).) However the substrate-indium phosphide interface has not entirely satisfactory electrical characteristics. (See the Bachmann et al, supra.) The contact problem to the substrate, e.g., graphite or molybdenum, is not amenable to the usual diffusion or alloying solution. Since CdS is preferably put on InP, the thin film InP layer is first deposited on a conducting substrate. However this procedure makes the side of the InP which requires alloying inaccessible. Therefore conventional techniques are inadequate.

The inadequacies of conventional techniques are particularly significant in solar cell devices. In such applications if a high resistance or blocking voltage contact cannot be reduced to suitable levels, the efficiency obtainable from the device is limited. It is apparent that a method of making a low resistance contact to polycrystalline semiconductor films, which does not involve alloying or diffusion and which satisfies the necessary adhesion, structural and electrical properties is quite desirable for some applications e.g., solar energy conversion.

SUMMARY OF THE INVENTION

It has been found that a p-type gallium arsenide layer deposited between a conducting substrate and an appropriate device semiconductor material, for example, indium phosphide, produces a contact between the conductor and the semiconductor which has the needed adhesion, structural and electrical properties. Specifically, blocking voltages below 0.05 and resistance less than 2Ω -cm$^2$ are obtained. The use of this intermediary GaAs layer significantly reduces many of the problems previously discussed. No alloying or diffusion is necessary so that the difficulties associated with those techniques are avoided. The deposition of p-type gallium arsenide on a conducting substrate is amenable to a convenient hydrogen transport, chemical vapor deposition (CVD) process.

DETAILED DESCRIPTION

In the preferred embodiment of the invention a hydrogen transport CVD process is used to deposit the GaAs layer on a conducting substrate. The substrate is chosen to have a coefficient of expansion (in the temperature range between room temperature and the reaction temperature of the CVD process) not so different for the gallium arsenide coefficient of expansion that adhesion is prevented. The substrate should also be chosen to be inert under the reaction conditions of the CVD process. Exemplary of suitable substrates is graphite (e.g., type 5890 PT, a molded totally purified high density graphite sold by Carbone-Lorraine Ind. Corp., Boonton, N.J.), tantalum, and molybdenum. Before deposition the substrate is cleaned to remove any foreign matter. For example, a graphite substrate is cleaned by rinsing in trichloroethane, followed by a methanol rinse and then firing in a hydrogen atmosphere at 1000° C.

An apparatus useful for the CVD deposition of GaAs on the cleaned substrate is described by Tietjen and Amick, in *J. Electrochem. Soc.*, 113, 724 (1968). (See FIG. 1 of that paper.) However, unlike the Tietjen paper no $H_2Se$ or $PH_3$ is introduced into the reaction chamber. Hydrogen chloride and $AsH_3$ are introduced into the reaction chamber in separate $H_2$ flows. The concentration of HCl or $AsH_3$ in these separate gas flows and the respective flow rates are not critical. Typically a 2% concentration of HCl or $AsH_3$ in hydrogen with a flow rate between 100 and 400 cc/min. (as measured in a 2¾ inch reaction tube) is adequate. The HCl gas flow is passed over a boat containing elemental gallium heated to a temperature between 500° and 1200° C preferably between 700° C and 900° C. This flow containing HCl and HCl-Ga reaction products is then combined with the $AsH_3$ containing flow and the dopant is also introduced. In the preferred embodiment zinc dopant is added by passing a pure hydrogen gas flow at a flow rate (for a 1 cm diameter tube) of between 20 and 200 cm³/min preferably between 40 and 60 cm³/min over elemental zinc heated to a temperature of between 250° and 600° C preferably between 300° and 400° C. Pure hydrogen if needed is added to the combined HCl-Ga, $AsH_3$ and Zn containing flows in a reaction zone heated to between 700° and 900° C to make the total flow rate between 100 and 3000 cm³/min preferably between 500 and 1000 cm³/min. The combined gas flow is then passed over the cleaned substrate heated to a temperature between 500° and 800° C preferably between 600° and 700° C. (The above conditions are those found suitable for a reaction tube which is 5 feet long and 2¾ inches inside diameter. A change of geometric configuration affects the endpoints of the ranges given. Additionally, there is an interdependence among conditions, so, for example, a higher flow rate ordinarily requires adjustment of the substrate temperature. A control sample is necessary to determine the best conditions for a given chamber geometry.)

The deposition process is continued until the desired thickness of GaAs is obtained. Thicknesses of at least 1 μm are desirable to produce a reliable contact while layers thicker than about 50 μ become uneconomical. Carrier concentrations between $10^{17}$ and $10^{20}$ cm$^{-3}$ are readily achievable by varying the zinc source temperature and the gas flow rate above this source. The useful carrier concentration depends on the conducting substrate employed. For graphite, a p-type carrier concentration between $10^{18}$ and $5 \times 10^{19}$ cm$^{-3}$ is appropriate. For tantalum or molybdenum carrier concentrations of approximately $2 \times 10^{19}$/cm$^{-3}$ are suitable.

The surface quality of the GaAs varies with the carrier concentration and the dopant used. The GaAs need not be continuous since a short between the conducting material and the adjacent semiconductor material of the device is in fact what is desired. Nevertheless the quality of the semiconductor material, e.g., indium phosphide, deposited on the GaAs upon the surface quality of the latter. The GaAs layer must be sufficiently uniform to promote the formation of a hole free semiconductor layer. In this regard the use of zinc as a dopant is advantageous since it contributes to the formation of a uniform GaAs layer.

The desired device is built on the deposited GaAs layer. The semiconductor material contacted must adhere without flaking to the GaAs and form an interface with the GaAs exhibiting a blocking voltage less than 0.05V and a resistance below 2 ohm cm². For example a thin layer of p-type indium phosphide satisfies these limitations. In a preferred embodiment, a p-type InP layer is deposited on the GaAs by a technique such as that described by Bachmann et al. in *J. Electrochem Soc.*, 123, 1509 (1976). This CVD process comprises flowing palladium-diffused hydrogen through a bubbler containing phosphorus trichloride held at a temperature between 0° and 5° C. The flow rate of the $H_2$ and the bubbler temperature is adjusted to produce a mole fraction of $PCl_3$ in $H_2$ of between 1 and 5%. The $PCl_3$ saturated $H_2$ is then flowed over elemental In heated to about 740° C. The $H_2$ flow finally is passed over the conducting substrate for deposition. A minor fraction of Cd or Zn dopant is added to the main gas flow upstream from the substrate by heating either elemental Cd or Zn in a separate $H_2$ stream to about 450° and 500° C respectively. The substrate with the GaAs is heated to about 630° C.

One or more semiconductor or metallic layers are then built upon the deposited semiconductor, e.g., InP, to complete the semiconductor device i.e., a device which has rectifying electrical characteristics. The method used for completing the device or the type of device ultimately made, e.g., p-n hetero junction or Schottky barrier, is not critical to the invention.

An example of a rectifying device within the invention is a p-InP/n-CdS hetero junction. In a preferred embodiment n-CdS is deposited on the p-InP (previously described) by a hydrogen transport CVD method using $H_2S$ as an etchant. (See copending application Ser. No. 718,386 filed Aug. 27, 1976.) Briefly, the p-InP/p-GaAs/substrate entity is placed in a reaction tube and heated to a temperature between 610° and 630° C. A gas flow of $H_2S$ in hydrogen is passed over a CdS source heated to a temperature between 690° and 710° C. Typically the mole fraction of $H_2S$ in hydrogen is between 2 and 3%. The hydrogen gas flow is then passed over the InP/GaAs/substrate entity. The deposition process is continued until the desired CdS thickness is obtained, typically 1 to 20 μm. However, since an etching of the InP does occur the polycrystalline InP is kept in the gas flow for a sufficiently short period of time to avoid etching through to the GaAs.

If the CdS is not the desired thickness when removed from the growth apparatus the layer thickness is increased by conventional techniques such as molecular beam expitaxy (see Wagner, *Appl. Phys. Letts.*, 22, 351 (1973) and *J. Appl. Phys.*, 45, 246 (1974).) Contact to the n-CdS layer is made via a grid of In or via a liquid In-Ga eutectic alloy. A p-InP/n-CdS device with a graphite substrate made as described above has for the GaAs coated conducting substrate-InP contact essentially no blocking voltage and a resistance of less than $2\Omega\text{-cm}^2$. This same device operated as a solar cell has a significantly increased efficiency over a similar p-InP/n-CdS device made by contacting a graphite substrate directly to the p-InP. (The efficiencies under air mass 2 conditions were respectively about 4.9 and 2.5%. However, some of the measured increase is attributable to the etching process used in depositing the CdS layer.)

What is claimed is:

1. A semiconductor device comprising (1) a device component which comprises a p-type semiconductor area in intimate contact with a composition selected from the group consisting of conducting and semiconducting materials, whereby a rectifying junction is formed between said p-type semiconductor area and said composition, said p-type semiconductor area of said device component forming an interface with (2) a contact component characterized in that said contact component comprises a layer of p-type gallium arsenide which contacts said device component, and an electrically conducting substrate in intimate contact with said layer of p-type gallium arsenide wherein said p-type semiconductor area is polycrystalline p-type indium phosphide and wherein the resistance of said interface is less than $2\Omega\text{-cm}^2$ and the blocking voltage is less than 0.05 V.

2. A semiconductor device of claim 1 wherein said electrically conducting substrate is a member of the group consisting essentially of graphite, tantalum and molybdenum.

3. A semiconductor device of claim 1 wherein said layer of p-type gallium arsenide has a carrier concentration in the range of $10^{18}\text{ cm}^{-3}$ to $5\times 10^{19}\text{ cm}^{-3}$.

4. A semiconductor device of claim 3 wherein said carrier concentration is produced by a zinc dopant.

5. A semiconductor device of claim 1 wherein said composition in intimate contact with said p-type semiconductor area is n-type CdS.

6. A semiconductor device of claim 5 wherein said electrically conducting substrate is graphite.

7. A semiconductor device comprising a conducting substrate having deposited thereon in succession a polycrystalline layer of p-type GaAs, a polycrystalline layer of p-type InP and a polycrystalline layer of n-type CdS.

8. The semiconductor device of claim 7 wherein said conducting substrate is chosen from the group consisting essentially of graphite, molybdenum and tantalum.

9. A semiconductor device containing a p-type InP layer deposited on a conducting substrate, wherein the contact to the substrate is improved by a layer of p-type GaAs deposited between said substrate and said InP layer.

* * * * *

UNITED STATES PATENT AND TRADEMARK OFFICE
CERTIFICATE OF CORRECTION

PATENT NO. : 4,074,305
DATED : February 14, 1978
INVENTOR(S) : Wilbur D. Johnston, Jr. and Joseph L. Shay It is certified that error appears in the above-identified patent and that said Letters Patent are hereby corrected as shown below:

```
Column 2, line 37, "(1976)" should not be in bold print.
Column 3, line 54, "1000" should not be in bold print.
Column 4, line 51, "hetero junction" should read
--heterojunction--.  Column 4, line 53, "hetero junction"
should read --heterojunction--.  Column 4, line 59, "630"
should not be in bold print.  Column 5, line 7, "(1974)"
should not be in bold print.
```

Signed and Sealed this

Fourth Day of July 1978

[SEAL]

Attest:

RUTH C. MASON
Attesting Officer

DONALD W. BANNER
Commissioner of Patents and Trademarks